(12) United States Patent
Rinerson et al.

(10) Patent No.: US 6,909,632 B2
(45) Date of Patent: Jun. 21, 2005

(54) MULTIPLE MODES OF OPERATION IN A CROSS POINT ARRAY

(75) Inventors: Darrell Rinerson, Cupertino, CA (US); Christophe J. Chevallier, Palo Alto, CA (US); Steven W. Longcor, Mountain View, CA (US); Edmond R. Ward, Monte Sereno, CA (US); Wayne Kinney, Emmett, ID (US); Steve Kuo-Ren Hsia, San Jose, CA (US)

(73) Assignee: Unity Semiconductor Corporation

(*) Notice: Subject to any disclaimer, the term of this patent is extended or adjusted under 35 U.S.C. 154(b) by 0 days.

(21) Appl. No.: 10/921,037

(22) Filed: Aug. 17, 2004

(65) Prior Publication Data

US 2005/0013172 A1 Jan. 20, 2005

Related U.S. Application Data

(63) Continuation of application No. 10/330,153, filed on Dec. 26, 2002, now Pat. No. 6,834,008.
(60) Provisional application No. 60/424,083, filed on Nov. 5, 2002, provisional application No. 60/422,922, filed on Oct. 31, 2002, and provisional application No. 60/400,849, filed on Aug. 2, 2002.

(51) Int. Cl.$^7$ .............................................. G11C 11/00
(52) U.S. Cl. ........................ 365/158; 365/173; 365/184
(58) Field of Search ................................. 365/158, 129, 365/173, 181, 182, 184

(56) References Cited

U.S. PATENT DOCUMENTS

| 5,496,759 A | 3/1996 | Yue et al. ..................... 437/52 |
| 5,640,343 A | 6/1997 | Gallagher et al. .......... 365/171 |
| 5,792,569 A | 8/1998 | Sun et al. .................... 428/692 |

(Continued)

OTHER PUBLICATIONS

A. Beck, J. Bednorz, A. Bietsch, Ch. Gerber, C. Rossel, D. Widmer, "Reproducible switching effect in thin oxide films for memory applications," Applied Physics Letters, vol. 77, No. 1, Jul. 3, 2000, pp. 139–141.

Asamitsu, A. et al., "Current switching of resistive states in magnetoresistive manganites", Nature, vol. 388, Jul. 3, 1997, 50–52.

C. Rossel, G.I. Meijer, D. Brémaud, D. Widmer, "Electrical current distribution across a metal–insulator–metal structure during bistable switching," Journal of Applied Physics, vol. 90, No. 6, Sep. 15, 2001, pp. 2892–2898.

Guo–Qiang Gong, Colossal magnetoresistance of 1 000 000–fold magnitude achieved in the antiferromagnetic phase of La$_{1-x}$ Ca$_x$MnO$_3$, Applied Physics Letters, vol. 67, No. 12, Sep. 18, 1995, 1783–1785.

Khartsev, S.I. etal., "Colossal magnetoresistance in ultrathin epitaxial La$_{1-x}$ Ca$_x$MnO$_3$ Films", Journal of Applied Physics, vol. 87, No. 5, Mar. 1, 2000, 2394–2399.

(Continued)

Primary Examiner—Richard Elms
Assistant Examiner—Hien Nguyen
(74) Attorney, Agent, or Firm—Morgan Malino

(57) ABSTRACT

Multiple modes of operation in a cross point array. The invention is a cross point array that uses a read voltage across a conductive array line pair during a read mode. The read voltage produces a read current that is indicative of a first program state when the read current is at a first level and indicative of a second program state when the read current is at a second level. The read current is ineffective to produce a change in program state. A first voltage pulse is used during a first write mode if a change from a second program state to a first program state is desired. A second voltage pulse is used during a second write mode if a change from the first program state to the second program state is desired.

8 Claims, 15 Drawing Sheets

U.S. PATENT DOCUMENTS

| | | |
|---|---|---|
| 5,793,697 A | 8/1998 | Scheueriein ........... 365/230.07 |
| 5,838,608 A | 11/1998 | Zhu et al. .................... 365/158 |
| 5,920,500 A | 7/1999 | Techrani et al. ............ 365/173 |
| 5,946,227 A | 8/1999 | Naji ........................... 365/158 |
| 6,055,178 A | 4/2000 | Naji ........................... 365/158 |
| 6,111,781 A | 8/2000 | Naji ........................... 365/158 |
| 6,128,214 A | 10/2000 | Kuekes et al. ............... 365/151 |
| 6,178,131 B1 | 1/2001 | Ishikawa et al. ......... 365/225.7 |
| 6,204,139 B1 | 3/2001 | Liu et al. |
| 6,226,160 B1 | 5/2001 | Gallagher et al. ........ 360/324.2 |
| 6,236,590 B1 | 5/2001 | Bhattacharyya et al. .... 365/173 |
| 6,242,770 B1 | 6/2001 | Bronner et al. ............. 257/295 |
| 6,256,223 B1 | 7/2001 | Sun ............................ 365/171 |
| 6,331,944 B1 | 12/2001 | Monsma et al. ............ 365/171 |
| 6,456,525 B1 | 9/2002 | Perner et al. ............... 365/171 |
| 6,473,332 B1 | 10/2002 | Ignatiev et al. ............. 365/148 |
| 6,531,371 B2 | 3/2003 | Hsu et al. ................... 438/385 |
| 6,534,326 B1 | 3/2003 | Hsu et al. ...................... 438/3 |
| 6,633,497 B2 | 10/2003 | Nickel ........................ 355/158 |

OTHER PUBLICATIONS

Liu et al., "A New Concept for Non–Volatile Memory: The Electric–Pulse Induced Resistive Change Effect in Colossal Magnetoresistive Thin Films," Non–Volatile Memory Technology Symposium, Nov. 7, 2001, pp. 1–7.

Liu et al., "Electric–pulse–induced reversible resistance change effect in magnetoresistive films," Applied Physics Letters, vol. 76, No. 19, May 8, 2000, pp. 2749–2751.

Y. Watanabe, J.G. Bednorz, A. Bietsch, Ch. Gerber, D. Widmer, A. Beck, "Current–driven insulator–conductor transition and nonvolatile memory in chromium–doped $SrTiO_3$ single crystals," Applied Physics Letters, vol. 78, No. 23, Jun. 4, 2001, pp. 3738–3740.

Zhao, Y.G. et al., "Effect of oxyen content on the structural, transport, and magnetic properties of $La_{1-\delta}Mn_{1-\delta}O$ thin films", Journal of Applied Physics, vol. 86, No. 11, Dec. 1, 1999, 6327–6330.

Zhuang W.W. et al., Novell Colossal Magnetorsistive Thin Film Nonvolatile Resistance Random Access Memory (RRAM) IEEE 2002, 0–7803–7463–X, 4 pages.

MULTIPLE MODES OF OPERATION IN A CROSS POINT ARRAY

CROSS-REFERENCE TO RELATED APPLICATIONS

This application is a continuation of "Cross Point Memory Array Using Multiple Modes of Operation," U.S. application Ser. No. 10/330,153, now U.S. Pat. No. 6,834,008 filed Dec. 26, 2002, which claims the benefit of U.S. Provisional Application No. 60/400,849, filed Aug. 02, 2002, the U.S. Provisional Application No. 60/422,922, filed Oct. 31, 2002, and the U.S. Provisional Application No. 60/424,083, filed Nov. 5, 2002, all of which are incorporated herein by reference in their entireties and for all purposes.

BACKGROUND OF THE INVENTION

1. Field of the Invention

The present invention relates generally to memory, and more specifically to memory employing a cross point array.

2. Description of the Related Art

Conventional nonvolatile memory requires three terminal MOSFET-based devices. The layout of such devices are not ideal, usually requiring feature sizes of $8\,f^2$ for each memory cell, where f is the minimum feature size.

However, not all memory elements require three terminals. Certain complex metal oxides (CMOs), for example, can retain a resistive state after being exposed to an electronic pulse, which can be generated from two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes.

Similarly, the IBM Zurich Research Center has also published three technical papers that also discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

Similarly, magnetic RAM (MRAM) requires only two terminals to deliver a magnetic field to the memory element. Other two terminal devices include Ovonic Unified Memory (OUM), which uses chalcogenic layers of material, and various types of ferroelectric memory. With only two terminals, it has been theorized that memory can be arranged in a cross point architecture.

However, mere recognition that a two terminal memory element is theoretically capable of being placed in a cross point array does not solve many of the non-trivial problems associated with actually creating such a device.

BRIEF DESCRIPTION OF THE DRAWINGS

The invention may best be understood by reference to the following description taken in conjunction with the accompanying drawings, in which.

It is to be understood that, in the drawings, like reference numerals designate like structural elements. Also, it is understood that the depictions in the figures are not necessarily to scale.

DETAILED DESCRIPTION OF THE PREFERRED EMBODIMENTS

Figure 1:
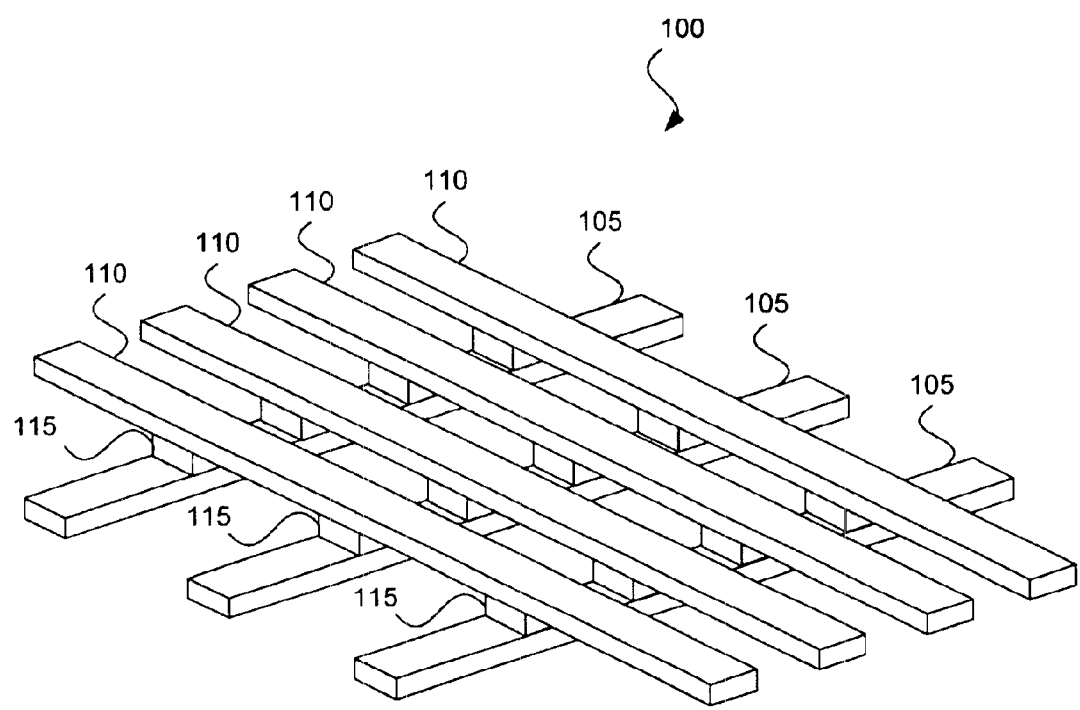
FIG. 1 depicts an exemplary cross point memory array in a perspective view.

FIG. 1 depicts an exemplary cross point array 100. A bottom layer of x-direction conductive array lines 105 and a top layer of y-direction conductive array lines 110 sandwiches a plurality of memory plugs 115. The conductive array lines 105 and 110 are arranged in the cross point array 100 so that each individual memory plug is capable of being uniquely identified and, therefore, uniquely selected by a single x-direction conductive array line and a single y-direction conductive array line.

Conductive array lines 105 and 110 can be constructed of any conductive material, such as aluminum, copper, tungsten or certain ceramics. Ideally, the material will withstand a high-temperature fabrication process, have a low inherent resistance, and have a low cost. Often, however, compromises will have to be made.

For example, if the memory element is a CMO, very high temperatures might be required to form a polycrystalline or a single crystalline structure. Depending upon the fabrication process (e.g., solution based spin on followed by high temperature anneal, pulsed laser deposition, sputtering, and metalorganic chemical vapor deposition) the fabrication temperature might require that refractory metals be used for conductive array lines. However, refractive array lines have higher resistances, which means that a given x-direction conductive array line would not be able to timely access as many y-direction conductive array lines as a lower resistance conductive array line, reducing the number of memory cells on the cross-point array 100. Therefore, compromises must be made in order to balance cost, size, resistivity and preferred fabrication techniques. Typically, a conductive array line would cross between 64 and 8192 perpendicular conductive array lines. Although the x-direction and y-direction conductive array lines can be of equal lengths (forming a square cross point array) they can also be of unequal lengths (forming a rectangular cross point array).

Each memory plug in the plurality of memory plugs 115 contains a memory element along with any other materials that may be necessary, such as an insulating layer in an MRAM or a seed layer in a CMO. Additionally, a CMO memory plug would preferably include a non-ohmic device, as is described in co-pending application "High Density NVRAM," U.S. application Ser. No. 10/360,005, filed Feb. 7, 2003. The non-ohmic device exhibits a very high resistance regime for a certain range of voltages ($V_{NO-}$ to $V_{NO+}$) and a very low resistance regime for voltages above and below that range.

Figure 2:
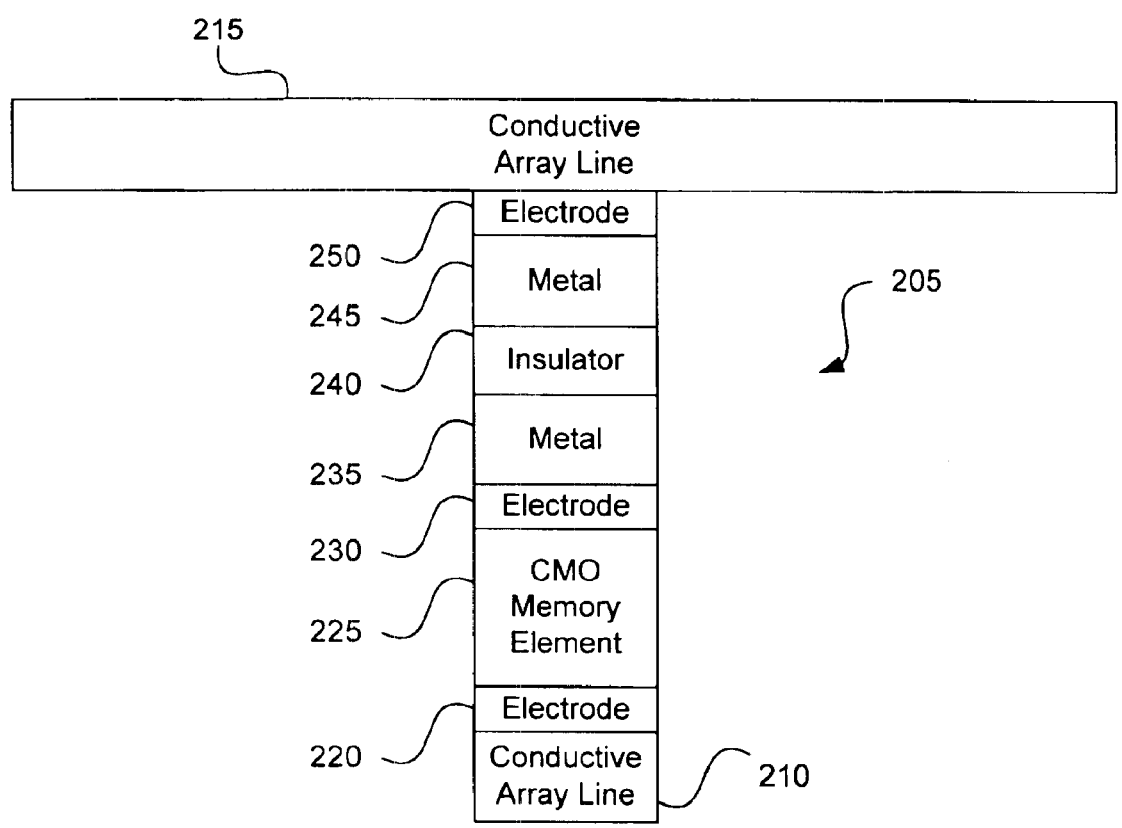
FIG. 2 depicts an exemplary memory plug in contact with two conductive array lines in a side view.

FIG. 2 depicts a side view of an exemplary memory plug 205 with seven separate thin-film layers and sandwiched between two conductive array lines 210 and 215. The seven layers are: an electrode layer 220, a layer of CMO material 225 (providing the memory element), another optional electrode layer 230, three layers that make up a metal-insulator-metal (MIM) structure 235, 240 and 245 (providing the non-ohmic device), and an optional final electrode 250.

The electrode layers 220, 230 and 250 are only necessary to the extent fabrication methods require them. Therefore, electrode layers 220, 230 and 250 would ideally be as thin as possible while still preventing metal inter-diffusion and, if necessary, being useful as a seed layer. Typical electrode layers 220,230 and 250 commonly used in fabrication include Pt, Au, Ag and Al. If the electrode layers 220, 230 and 250 are used only as a barrier to prevent metal inter-diffusion, then a thin layer of metal, e.g. TiN, could be used. Any number of electrically conductive materials can be used for CMO material's 225 seed layer 220. For example, the seed layer 220 could be a conductive perovskite, such as $LaNiO_3$ or $SrRuO_3$ on Pt, a conductive metal oxide, such as $IrO_2$ on Ir or $RuO_2$ on Ru, a noble metal such as Pt on TiN. To make fabrication more efficient, the other electrode layers 230 and 250 could use the same conductive layer that was used on the seed layer 220.

The CMO material 225 thickness is dictated by the desired resistive states of the CMO material 225 and the write threshold voltage ($V_{Wth}$). Although very dramatic differences (e.g., 1000 times difference) between a low resistance state ($R_1$) and a high resistive state ($R_0$) could be sensed very easily, the voltage that drives such resistances would be less than ideal. Since large currents can be destructive to semiconductors fabricated to small dimensions, no more than 10 μA would be desired for a memory circuit in most cases. Therefore, a modest difference between $R_0$ and $R_1$ would typically be a better choice. For example, if 1 volt were used as a read voltage ($V_R$), $R_1$ might be about 100 kΩ and $R_0$ might be about 1 MΩ, making the current either 10 μA or 1 μA, depending on the resistive state. Once a $V_R$ is identified, a desired write voltage ($V_W$) can be determined. Not only should $V_W$ be greater than $V_R$, but it should also be far enough away from $V_R$ to allow minor voltage fluctuations (e.g., due to fabrication imperfections) to have a negligible effect on the CMO material 225. Similarly, $V_W$ should be greater than $V_{Wth}$ for the same reason. A typical $V_W$ might be about 2 volts, and $V_{Wth}$ might be about 1.5 volts. A CMO material 225 with a $V_{Wth}$ of 1.5 volts might be between 1000 Å and 3000 Å thick.

The CMO material 225 will generally be a crystalline or polycrystalline perovskite structure. Generally, the CMO material 225 includes two or more metals, the metals being selected from the group consisting of transition metals, alkaline earth metals and rare earth metals. The CMO material 225 can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanites (e.g., STO:Cr), zirconates (e.g., SZO:Cr, $Ca_2Nb_2O_7$:Cr, and $Ta_2O_5$:Cr), and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective CMO material 225 for use in a memory plug 205.

Figure 3:
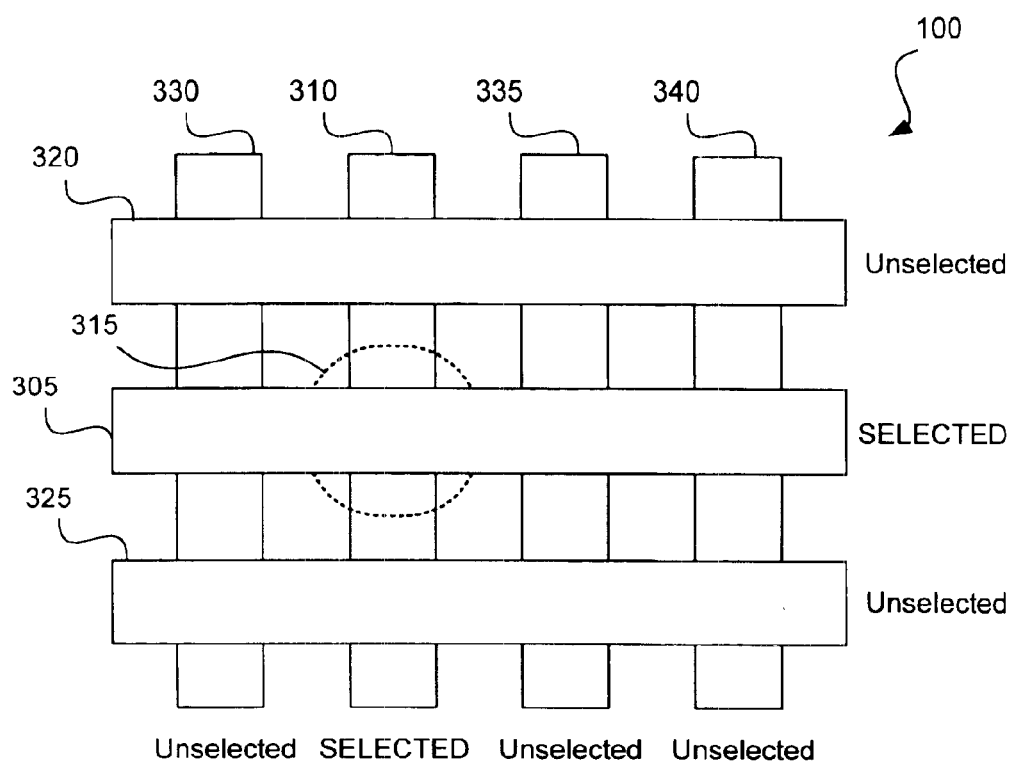
FIG. 3 depicts the exemplary cross point memory array in a plan view.

The properties of the MIM structure 235, 240 and 245 (an example of a non-ohmic device) would then be dependant on ½ $V_R$. FIG. 3 illustrates selection of a cell in the cross point array 100. The point of intersection between a single x-direction conductive array line 305 and a single y-direction conductive array line 310 uniquely identifies a single memory plug 315. However, the selected conductive array lines 305 and 310 deliver a voltage to every memory plug associated with those conductive array lines. Therefore, the non-ohmic device must be able to block current of the maximum voltage that will be seen on a single conductive array line but pass current from the minimum voltage seen on a selected memory plug. If each conductive array line 305 and 310 supplies half the required voltage of each operation, then ½ $V_W'$ would be the maximum voltage on a single conductive array line and $V_R'$ would be the minimum voltage seen on a selected memory plug. $V_W'$ is $V_W$ plus all other voltage drops in the memory plug 315 (e.g., $V_{NO+}$) and $V_R'$ is $V_R$ plus all other voltage drops in the memory plug 315.

Figure 4:
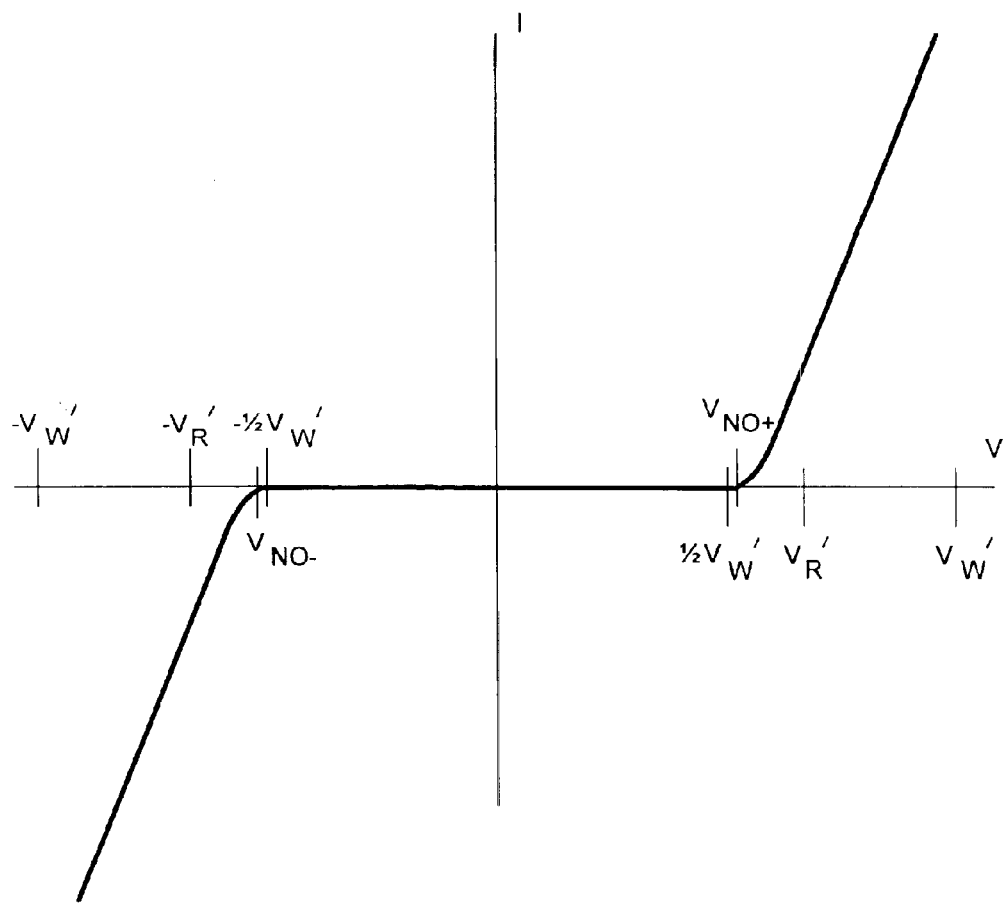
FIG. 4 is a graph illustrating exemplary IV characteristics of a memory plug.

If the non-ohmic device is the only other element that causes a voltage drop, the minimum $V_{NO+}$ can be calculated from $V_{NO+}=½\ V_W'=½(V_{NO+}+V_W)=V_W)$. A $V_{NO+}$ of 2V would cause $V_W'$ to be 4V and $V_R'$ to be 3V. However, a higher $V_{NO+}$ might be appropriate to allow for some fabrication inconsistencies and other additional elements in the memory plug that provides a voltage drop. For example, with a $V_W$=2V, a $V_{NO+}$ of 4V would cause $V_W'$ to be at least 6V and $V_R'$ to be at least 4V. Once a $V_{NO+}$ is selected, then the thickness of the non-ohmic device (e.g., MIM 235, 240 and 245) can be calculated. FIG. 4 illustrates exemplary IV characteristics of a memory plug.

The metal portion 235 and 245 of the MIM can be made of any conductive material. However, to make fabrication more efficient, the metal portion 235 and 245 of the MIM could use the same conductive layer that was used with the seed layer 220. Therefore, metal layers 235 and 245 of the MIM could also also serve as the electrode layers 230 and 250, removing the need to have a separate electrode layers 230 and 250. The insulator layer 240 of the MIM can be realized with $Ta_2O_5$, an amorphous SiC layer, or other such materials.

Other structures that might be used for the non-ohmic device include at least two oppositely oriented diodes. The oppositely oriented diodes can be connected either in series or in parallel.

When two diodes are in series, one diode's forward current is blocked by the other diode at low voltages. However, at the breakdown voltage of each diode, the resistance to current flow diminishes greatly. Hence, in this embodiment, it is the diodes' breakdown voltages that define $V_{NO+}$ and $V_{NO-}$.

When the diodes are in parallel, multiple diodes could be used in a diode ring formation in order to have an appropriate forward bias voltage drop. For example, if each diode where to have a forward bias voltage drop of 0.7V, placing two diodes in series oriented in the same direction would produce a total forward bias voltage drop of 1.4V. Similarly, a chain of two diodes in parallel with and oppositely oriented to the previous two diodes would cause the entire non-ohmic device to exhibit a high resistance from −1.4V to +1.4V.

Yet another structure that might be used was described in a paper called "A switching Device based on a-Si:H N-i-dp-i-n stacked structure: Modeling and characterization," by Domenico Caputo and Giampiero de Cesare (IEEE Transactions on Electron Devices, Vol 43, No 12, December 1996), incorporated herein by reference for all purposes. The five layer structure described in the paper consists of an n-type silicon layer, an intrinsic silicon layer, a very thin p-type silicon layer, an intrinsic silicon layer and an n-type layer.

Those skilled in the art will appreciate that the above-described voltages are voltages seen by the memory plug 315, and not necessarily the absolute values of the voltages from ground. For example, placing 10 volts on the selected x-direction conductive array line 305 and 6 volts on the selected y-direction conductive array line 310 would still attain a 4-volt drop. If the voltage drop across any single unselected memory plug was to be no more than 3 volts, then unselected conductive array lines 320, 325, 330, 335 and 340 would need to be held somewhere between 7 volts and 9 volts in the above example.

Preferably, the unselected conductive array lines 320, 325, 330, 335 and 340 would be held at a constant voltage, regardless of whether a read or write operation was being performed. Therefore, if the selected x-direction conductive array line 310 were placed at 12 volts, then the y-direction unselected conductive array lines 320 and 325 would need to be held at 9 volts in the above example in order to keep the maximum voltage drop to 3 volts. If symmetry was desired, a write operation might require the x-direction conductive array line 310 be held to 11 volts, the y-direction conductive array line 305 be held to 5 volts and all the unselected conductive array lines 320, 325, 330, 335 and 340 be held to 8 volts (halfway between the voltages of the two conductive array lines 305 and 310 for both read and write operations).

Figure 5A:
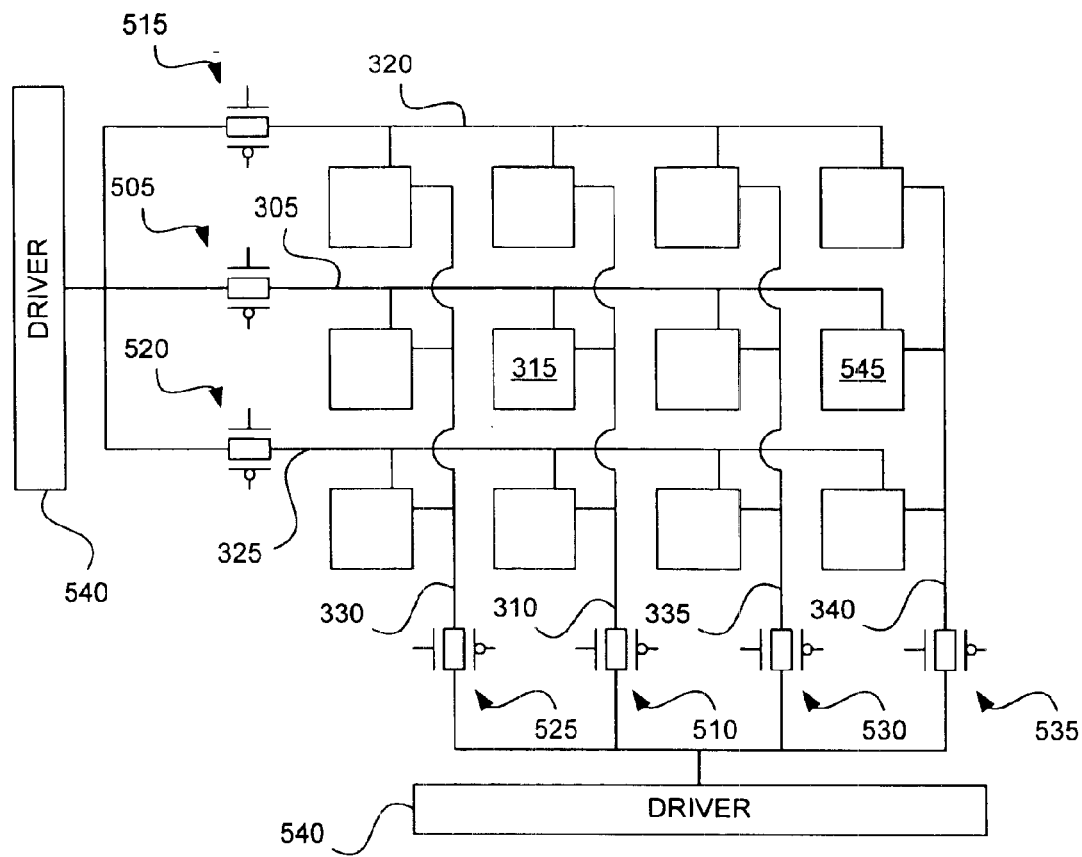
FIG. 5A is a block diagram depicting the logical connections of various systems that contribute to selecting a memory plug.
Figure 5B:
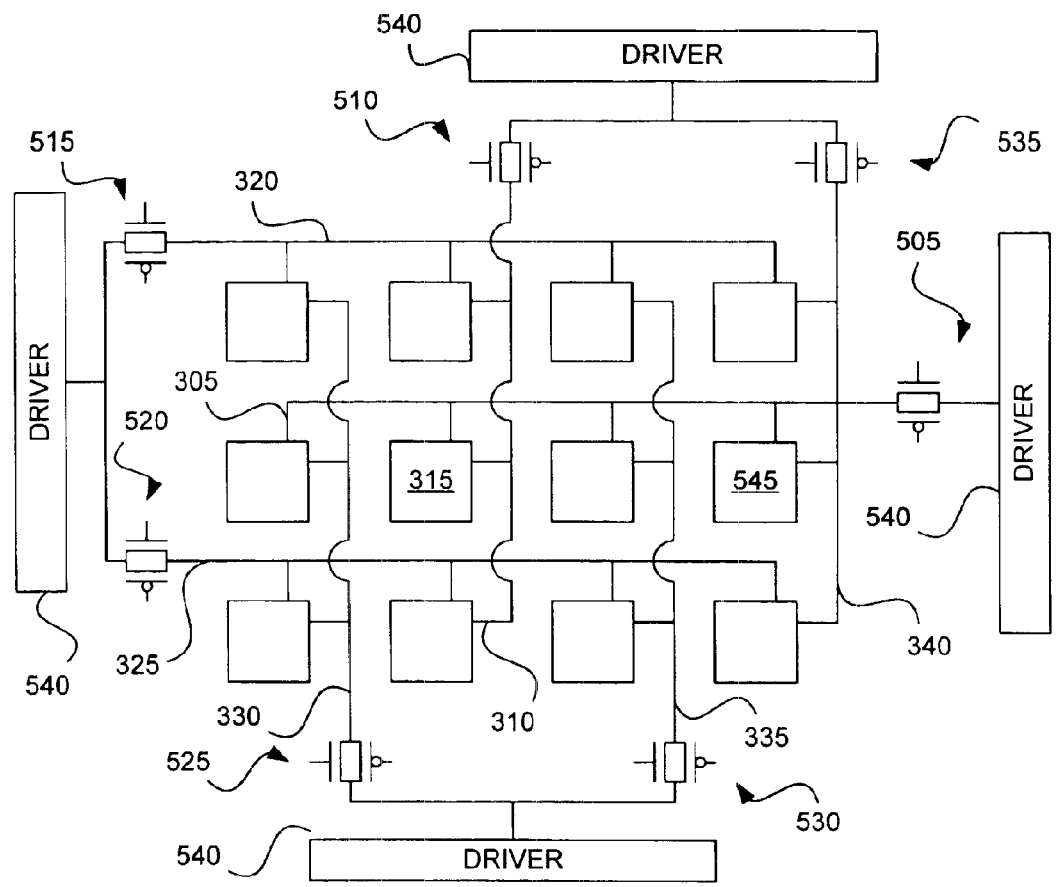
FIG. 5B is a block diagram depicting the physical connections of the various systems that contribute to selecting a memory plug.

As illustrated in the preferred embodiment of FIGS. 5A and 5B, each conductive array line 305, 310, 320, 325, 330, 335 and 340 is associated with a pass device 505, 510, 515, 520, 525, 530 and 535 (one n-type and one p-type transistor). The gate voltages of each transistor are adjusted such that the selected conductive array lines 305 and 310 are allowed to pass a voltage from the drivers 540. The voltage that is passed can either be the full voltage from the drivers 540 during a write operation (a magnitude of 3 volts in the above example) in a first select mode, a partial voltage during a read operation (a magnitude of 2 volts in the above example) in a second select mode, or no voltage for the unselected lines in an unselect mode. Therefore, the pass devices 505 can act as part of the decoding circuitry as a type of modulating circuit, allowing one conductive array line to be on ("selected") at either a read or write voltage and the other conductive array lines to be off ("unselected"). FIG. 5A illustrates the logical connections and FIG. 5B illustrates the same connections, but with a different physical layout (the pass devices alternating on each end of the conductive array lines).

Alternatively, in place of the pass device 505, 510, 515, 520, 525, 530 and 535, a single transistor can be used. However, the transistor's gate voltage would need to be such that it could pass large magnitude voltages. For example, an n-channel transistor would pass the full 3V if its gate were held to 3V plus the n-channel transistor's threshold voltage. A single transistor could still act as a modulating circuit by only partially turning on the transistor.

In another embodiment, the modulation is performed upstream of the gate circuit. Regardless of whether the gate circuit is a pass device or a single transistor, the input to the gate circuit would already be at an appropriate read or write voltage. In this embodiment, the gate circuit would only have a first select mode (passing substantially the full input voltage) and an unselect mode (passing substantially no voltage).

It should be noted that if the unselected conductive array lines 320, 325, 330, 335 and 340 were not held to a certain voltage, they would be considered floating, which is generally discouraged in circuit design. Specifically, a problem would arise if, for example, an unselected y-direction conductive array line 340 were floating at −3 volts. If the selected x-direction conductive array line 305 was at 3 volts and the selected y-direction conductive array line 310 was at −3 volts, two cells 315 and 545 would see a 6-volt drop, potentially disturbing the resistive states of both cells.

Figure 6A:
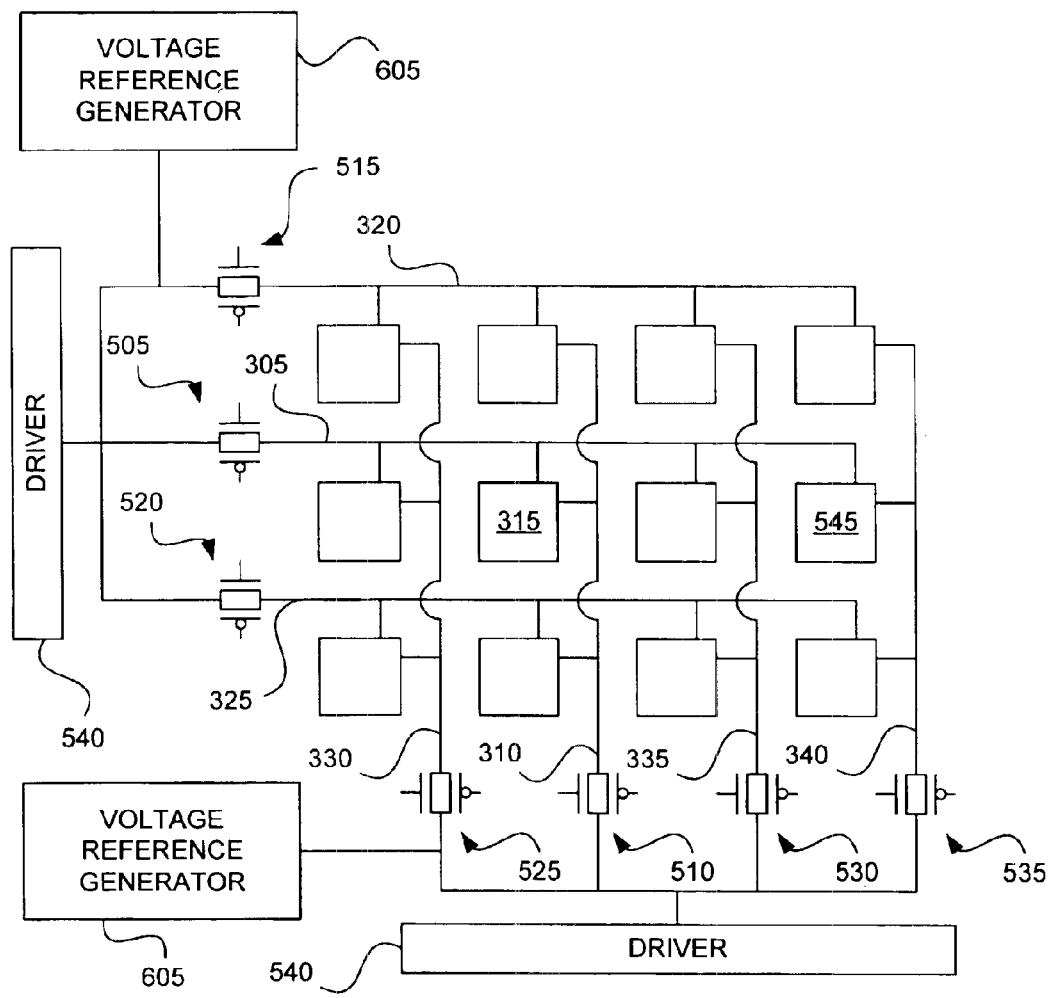
FIG. 6A is a block diagram depicting one mechanism for preventing the unselected conductive array lines from floating to an undesired voltage.

FIG. 6A illustrates one mechanism for preventing the unselected conductive array lines 320, 325, 330, 335 and 340 from floating to an undesired voltage. Prior to a read or write operation, each pass device 505, 510, 515, 520, 525, 530 and 535 would have both of their transistors turned on, the drivers 540 would be deactivated, and voltage reference generators 605 would be at some reference voltage (presumed to be ground for the remainder of this document). Therefore, all the conductive array lines 305, 310, 320, 325, 330, 335 and 340 would be pulled to the reference voltage. During the read or write operation, the voltage reference generator 605 would be deactivated, the driver 540 would be activated, and only the appropriate pass devices 505 and 510 would be on, bringing the selected conductive array lines 305 and 310 to the driver voltage. Although the unselected conductive array lines 320, 325, 330, 335 and 340 would be floating during a read or write operation, their parasitic capacitance might keep them at the reference voltage for the time it takes to do a normal read or write cycle. However, lateral coupling capacitance will work against the parasitic capacitance, raising the voltage on the unselected conductive array lines 320, 325, 330 and 335 adjacent to the selected conductive array lines 305 and 310.

Figure 6B:
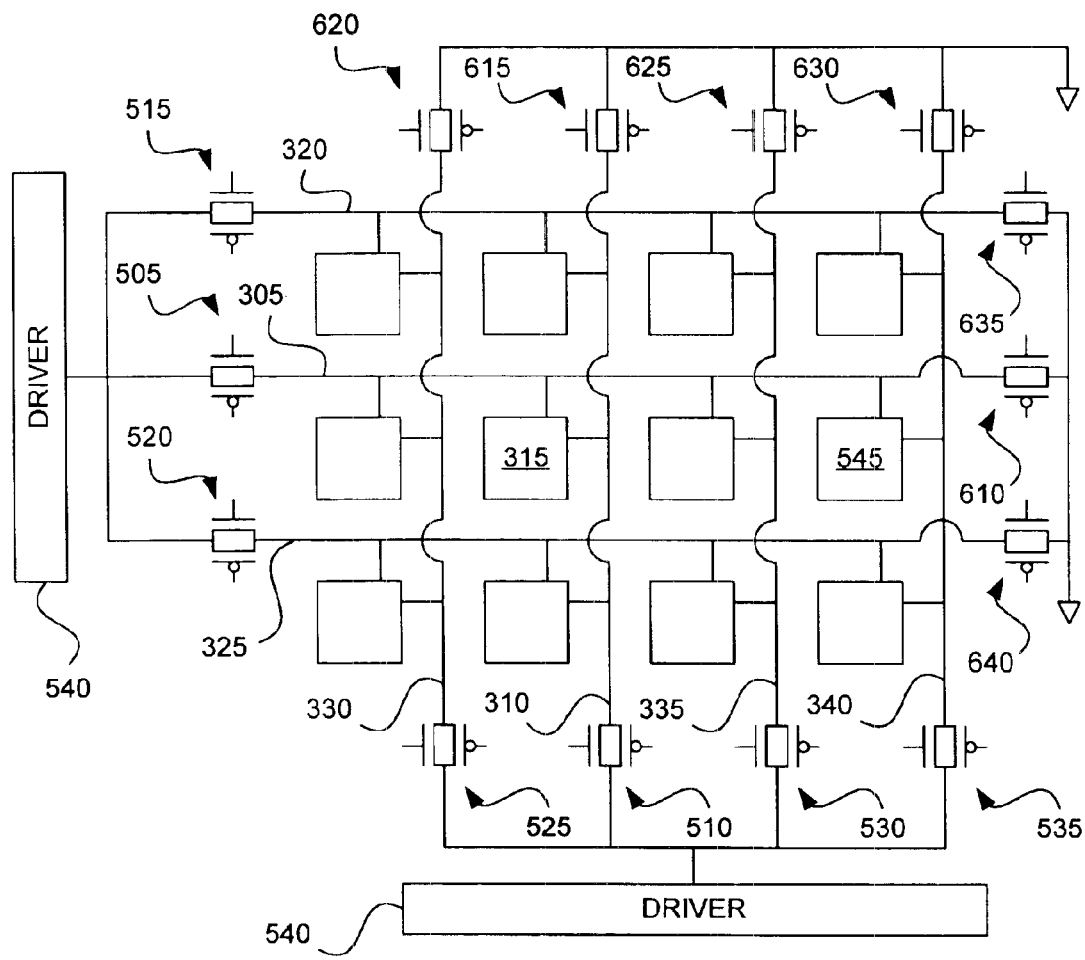
FIG. 6B is a block diagram depicting another mechanism for preventing the unselected conductive array lines from floating to an undesired voltage.

FIG. 6B illustrates another mechanism for preventing the unselected conductive array lines 320, 325, 330, 335 and 340 from floating to an undesired voltage. Each conductive array line 305, 310 320, 325, 330, 335 and 340 would have an associated grounding pass device 610, 615, 620, 625, 630, 635 and 640 that allows the conductive array lines 305, 310 320, 325, 330, 335 and 340 to be pulled to ground when activated.

The grounding pass devices 610, 615, 620, 625, 630, 635 and 640 could be activated prior to a read or write operation (similar to the operation described in connection with FIG. 6A), could be triggered by the selection of a conductive array line, or could always be kept on. If the grounding pass devices 610, 615, 620, 625, 630, 635 and 640 were always on, their relative size would need to be small in relation to the decoding pass devices 505, 510, 515, 520, 525, 530 and 535 so that the leakage to ground would have a small effect.

If the grounding pass devices 610, 615, 620, 625, 630, 635 and 640 were triggered by the selection of a conductive array line, the process of selecting the x-direction conductive array line 305, would activate the decoding pass device 505 and deactivate the grounding pass device 610 associated with the selected conductive array line 305 while deactivating the decoding pass devices 515 and 520 and activating the grounding pass devices 635 and 640 associated with the unselected conductive array lines 320 and 325. Similarly, selecting the y-direction conductive array line 310 would activate the decoding pass device 510 and deactivate the grounding pass device 615 associated with the selected conductive array line 310 while deactivating the decoding pass devices 525, 530 and 535 and activating the grounding pass devices 620, 625 and 630 associated with the unselected conductive array lines 330, 335 and 340.

Figure 6C:
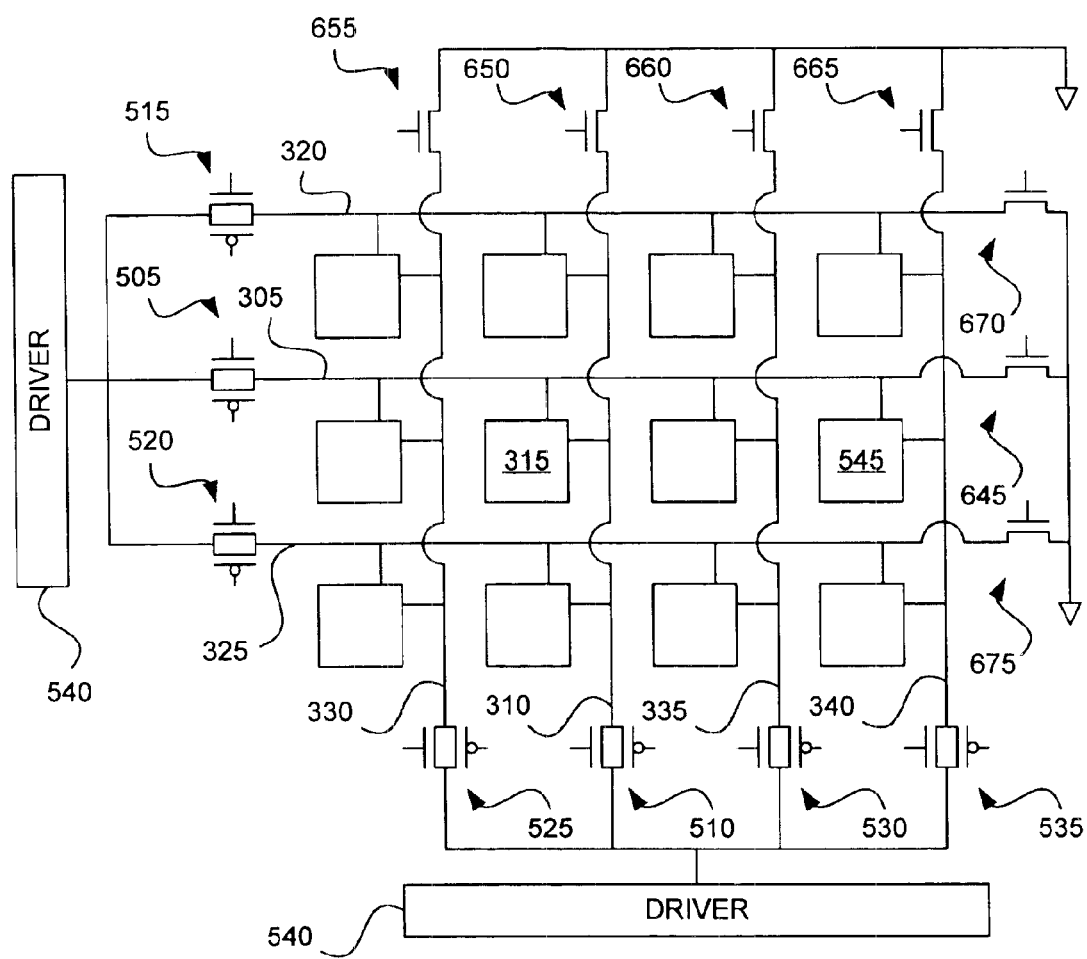
FIG. 6C is a block diagram depicting an improvement on the mechanism for preventing the unselected conductive array lines from floating to an undesired voltage depicted in FIG. 6B.

FIG. 6C is an improvement on FIG. 6B. However, instead of pass devices 610, 615, 620, 625, 630, 635 and 640, a single transistor 645, 650, 655, 660, 665, 670 and 675 is used. Assuming the transistors 645, 650, 655, 660, 665, 670 and 675 were n-channel devices, they would be on only if the gate voltage were held to at least the threshold voltages of the transistors. Similarly, if the transistors were p-channel devices, they would be on if the gate voltages were held to at least the negative threshold voltages. Therefore, an appropriate gate voltage can fully discharge the conductive array lines.

Figure 6D:
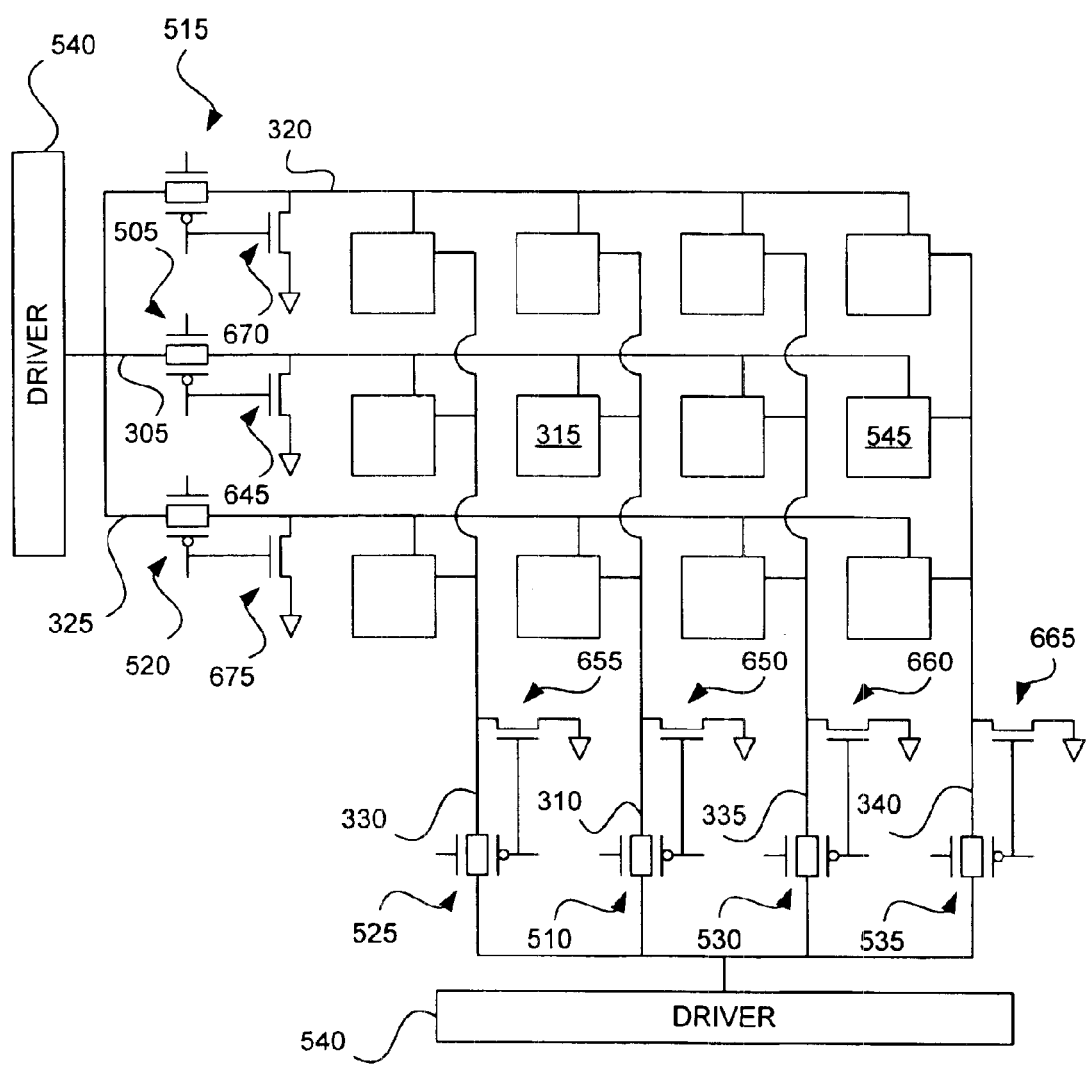
FIG. 6D is a block diagram depicting an improvement on the mechanism for preventing the unselected conductive array lines from floating to an undesired voltage depicted in FIG. 6C.

The single n-channel (or p-channel) transistor embodiment can be used either at the beginning of a cycle or by using the inverse of the signal that activates the n-channel (or p-channel) portion of the decoding pass devices 505, 510, 515, 520, 525, 530 and 535. As shown in FIG. 6D, in some embodiments, the inverse signal might simply be the p-channel (or n-channel) portion of the decoding pass devices 505, 510, 515, 520, 525, 530 and 535.

Figure 6E:
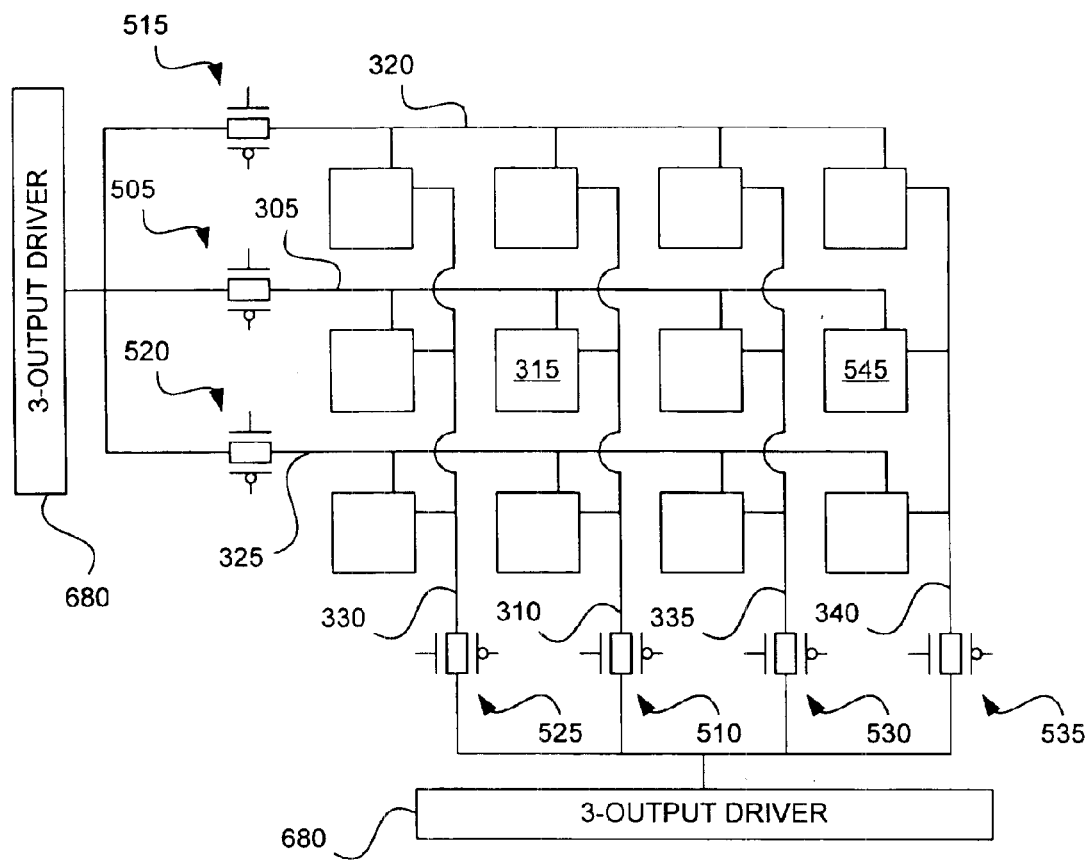
FIG. 6E is a block diagram depicting yet another mechanism for preventing the unselected conductive array lines from floating to an undesired voltage by using a 3-output driver.

FIG. 6E illustrates yet another mechanism for preventing the unselected conductive array lines 320, 325, 330, 335 and 340 from floating to an undesired voltage by using a 3-output driver 680. Since the 3-output driver 680 would deliver a voltage to all of the decoding pass devices 505, 510, 515, 520, 525, 530 and 535, such a mechanism could not be used while a specific conductive array line was being selected. Therefore, the 3-output driver 680 could either be used to discharge the floating voltages prior to a read or write operation. Alternatively, the 3-output driver 680 could be used during a read or write operation if it were only used in connection with unselected banks, assuming multiple 3-output drivers 680 are used for multiple banks.

Figure 7:
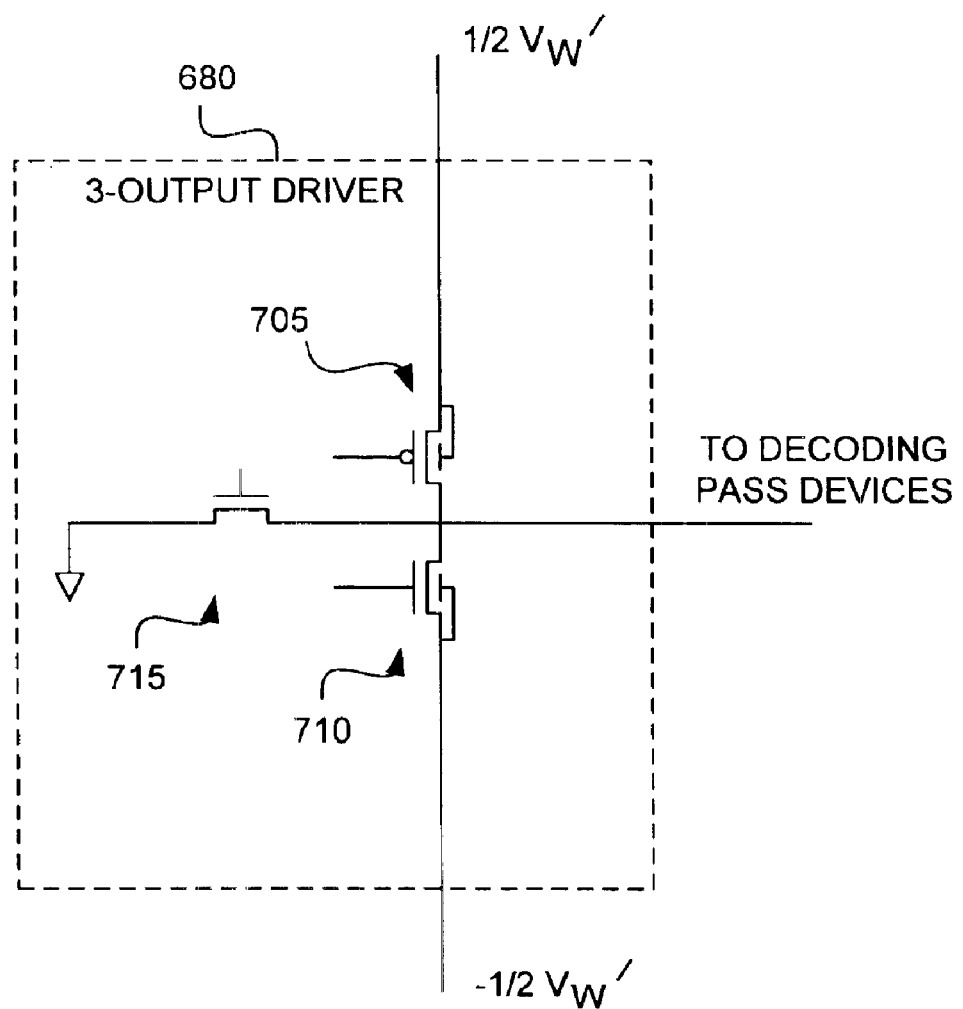
FIG. 7 is a block diagram depicting one possible configuration of a 3-output driver.

FIG. 7 illustrates one possible configuration of a 3-output driver 680. A p-channel transistor 705 and an n-channel transistor 710 are arranged in series. The n-channel transistor may be in a separate well from the CMOS logic because the substrate is tied to a negative voltage. The source of the p-channel transistor 705 is connected to a voltage source of $+\frac{1}{2} V_W'$ and the source of the n-channel transistor 710 is connected to a voltage source of $-\frac{1}{2} V_W'$. The drains of both transistors are connected to both the decoding pass devices 505, 510, 515, 520, 525, 530 and 535 and transistor to ground 815. In order to discharge the entire line, the transistor to ground 715 would need to have an appropriate gate voltage, as described in connection with FIG. 6C, or be a pass device. The 3-output driver 680 would function when only one transistor 705, 710 or 715 was on, while the other two transistors were off.

Depending on the embodiment, the driver 540 or the 3-output driver 680, must be able to supply either $+\frac{1}{2} V_W'$ or $-\frac{1}{2} V_W'$ to the decoding pass devices 505, 510, 515, 520, 525, 530 and 535. This is because applying a pulse of $V_W'$ in one direction ($+V_W'$) will decrease the resistive state of the CMO material 225 from $R_0$ to $R_1$ and applying a pulse of $V_W'$ in the opposite direction ($-V_W'$) will increase the resistive state from $R_1$, to $R_0$.

The polarity of the voltage drop is not important during a read. The resistive state of the memory element can be detected regardless of whether the x-direction conductive array line 305 is $V_R'$ higher or $V_R'$ lower than the y-direction conductive array line 310. However, it is probably desirable to alternate polarities of reads so the memory elements will not be subjected to any long-term read disturbs.

Additionally, a write operation would usually be preceded by a read operation in order to ensure a write is necessary. In other words, $+V_W'$ should only be applied to a memory plug in its $R_0$ resistive state and $-V_W'$ should only be applied to a memory plug in its $R_1$ resistive state. By ensuring that a voltage pulse is only used when the CMO material 225 needs to change state, the CMO material 225 would not either be placed in a resistive state lower than $R_1$ or higher than $R_0$ or suffer any degradation that occurs with certain CMO materials. Additionally, avoiding a write operation will reduce disturbing the unselected cells and improve the endurance of the selected cell, avoiding unnecessarily stressing the cross point memory array 100.

If a read operation is used prior to a write operation, the polarity of the read should be the same as the polarity of the write operation that would follow, if required. For example, if the data to be written is "0" then the selected x-direction conductive array line 305 would be 3V and the selected y-direction conductive array line 310 would be −3V. If the read operation preceding the write used +2V on the selected x-direction conductive array line 305 and −2V on the selected y-direction conductive array line 310, then the circuitry would only need to switch 1V for both conductive array lines 305 and 310. This can be preferable to the alternative (−2V on the selected x-direction conductive array line 305 and +2V on the selected y-direction conductive array line 310), which would require the voltage to switch a total of 5V.

The ability of the CMO material 225 to be placed into several different resistive states can be exploited to store more than one bit of information per memory plug 205. By adjusting the pulse width and voltage height of the voltage pulses that change the resistive states of the CMO material 225, multiple resistive states can be used. For example, the CMO material 225 might have a high resistive state of $R_{00}$, a medium-high resistive state of $R_{01}$, a medium-low resistive state of $R_{10}$ and a low resistive state of $R_{11}$. A sensitive reading mechanism might be able to distinguish between three or more bits of information contained in the CMO material 225.

Figure 8A:
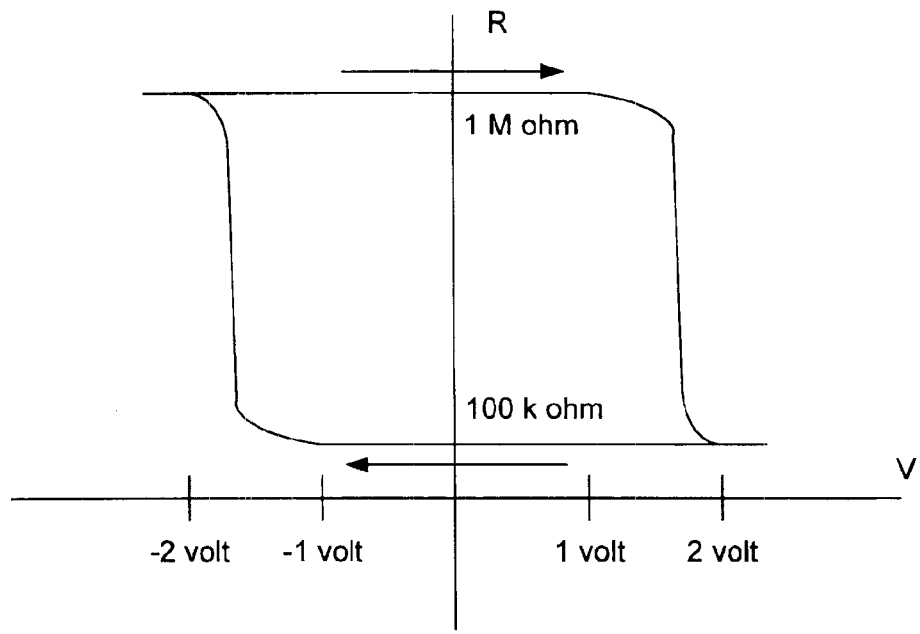
FIG. 8A is a graph illustrating exemplary RV characteristics of a memory element initially biased in one direction

A benefit of some CMO materials is that the characteristic hysteresis allows non-destructive reads. As shown in FIG. 8A any voltages between $-V_R$ ($-1$ volt) and $+V_R$ (1 volt) will have no effect on the resistive state of the memory element (i.e., it will remain at either 100 k$\Omega$ or 1 M$\Omega$). Therefore, a write operation is not necessary after a read operation for such materials.

As shown in FIG. 8A, the hysteresis has two write threshold voltages, one for when the CMO material 225 is in the low resistive state and one for when the CMO material 225 is in the high resistive state. In the low resistive state, the first write threshold voltage is the point above which any voltages applied across the CMO material 225 have substantially no effect on the resistive state of the CMO material 225 and below which a voltage pulse will alter the resistance of the CMO material 225. Similarly, in the high resistive state, the second write threshold voltage is the point below which any voltages applied across the CMO material 225 have substantially no effect on the resistive state of the CMO material 225 and above which a voltage pulse will alter the resistance of the CMO material 225.

Figure 8B:
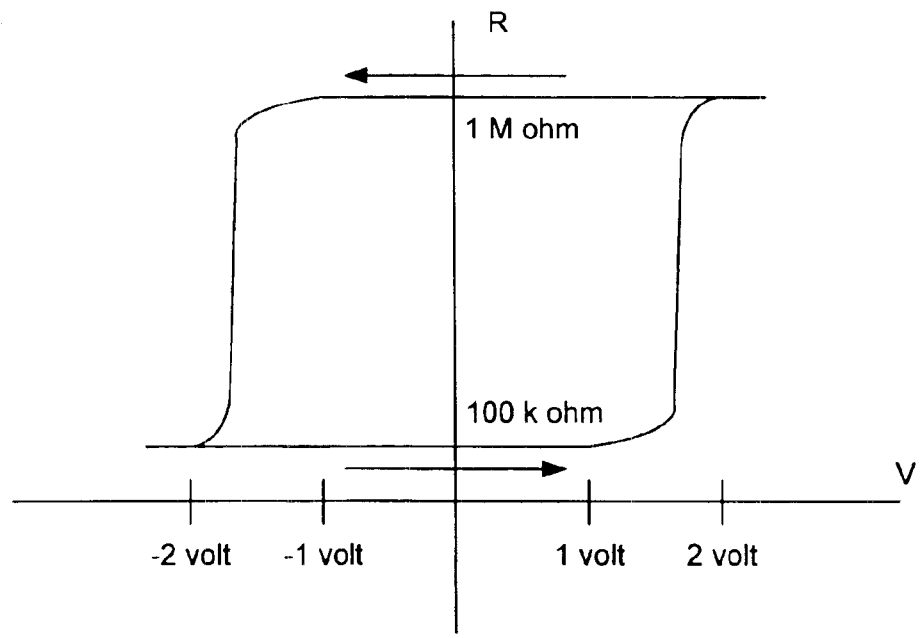
FIG. 8B is a graph illustrating exemplary RV characteristics of a memory element initially biased in the other direction.

When initially fabricated, the CMO material 225 may be in a high resistive state. The CMO material 225 then transitions from its high resistive state to a low resistive state in response to a voltage pulse. Whether the x-direction conductive array line 305 is at $+3V$ and the y-direction conductive array line 310 is at $-3V$ in order to lower the resistive sate or visa-versa depends upon the specific properties of the material that is used. FIG. 8A is an example of the CMO material 225 that requires a $+2V$ pulse to lower its resistive state and FIG. 8B, a mirror image of FIG. 8A, is an example of the CMO material 225 that requires a $-2V$ pulse to lower its resistive state.

It should be noted that the actual write voltage that is used on the CMO material 225 is greater in magnitude than the write threshold voltage. The actual write voltage is a voltage pulse that would place the CMO material 225 into the desired resistive state, which may be lower than the highest physically attainable resistive state and higher than the lowest attainable resistive state. However, in FIG. 8A the appropriate write voltage for the previously described exemplary CMO material 225 is $-2V$ when it is in its low resistive state and 2V when it is in its high resistive state.

Ideally, the CMO material 225 should switch very quickly from one resistive state to another. For current applications, anything less than 50 nanoseconds would be an appropriate switching speed. Additionally, once the CMO material 225 is placed in a resistive state, it should be able to retain that state for long periods of time. Ideally, the material should retain its resistive state for over ten years. Since the read voltage should not affect the resistive state, repeated application of the read voltage over ten years should not change the resistive state of the CMO material 225.

Generally, the chemical and materials properties of the memory element are selected to meet the electrical specifications set forth above. For example, the material preferably has a resistivity of not greater than about 1 ohm-cm, exhibits a change in resistance of at least about 10x, and has this resistance change triggered by the application of a voltage pulse of not longer than about 100 ns duration and not greater than about 3V in magnitude. In addition, the memory element material should be compatible with the requirements imposed by the general fabrication process of the entire high density RAM. Of course, there is some flexibility in the process constraints. Thus, process and design engineers will have certain ranges of chemical, materials, and process parameters available to tailor for the specific goals at hand. Among these parameters are the annealing conditions, the deposition temperature and method, and the material stoichiometry and the thickness.

To allow rapid access times (on the order of tens of nanoseconds) in small dimension devices (on the order of hundreds of nanometers), the memory element material should have a resistivity of not more than about 1 ohm-cm. It is known that the resistivity of the complex metal oxides depends upon various factors, often including some of the following: film thickness, oxygen content of the film, stoichiometry, elemental composition, deposition method and conditions, degree of crystallinity, crystallite size, crystalline orientation, and doping level and choice of dopant. Current research indicates that suitably low resistivity (less than or equal to 1 ohm-cm) CMO materials can be achieved by judicious choice of these parameters.

One example of a suitable film thickness for the memory applications of this invention is approximately 1000 Å to 3000 Å. Thinner films sometimes have higher strains, usually resulting from a slight misalignment with the seed layer, which can result in higher resistivity. Film thickness has been discussed by S. I. Khartsev, et al. in "Colossal magnetoresistance in ultrathin epitaxial $La_{0.75}Sr_{0.25}MnO_3$ films," Journal of Applied Physics, Vol. 87, No. 5, 1 Mar. 2000, which is hereby incorporated by reference for all purposes.

Another factor that affects resistivity is the oxygen content of the film. By properly controlling the exposure to oxygen during deposition and annealing (if any) the resistivity can be controlled. It has been observed that 1500 Å lanthanum manganese oxide (LMO) films deposited by pulsed laser deposition in oxygen environments have a lower resistivity than films deposited in vacuum (but otherwise identical conditions). See Y. G. Zhao, et al., "Effect of oxygen content on the structural, transport, and magnetic properties of $La_{1-\delta}Mn_{1-\delta}O_3$ thin films," Journal of Applied Physics, Vol. 86, No. 11, 1 Dec. 1999, which is hereby incorporated by reference for all purposes. Cooling down the freshly deposited film in an oxygen-containing atmosphere further decreases film resistivity.

It has been further observed that adjusting the relative amounts of the rare earths and the alkaline earth metals can modify resistivity. Higher ratios of alkaline earth to rare earth metals can, to a degree (e.g., up to about 50:50 in lanthanum calcium manganese oxides), lower resistivity. See Guo-Qiang Gong, et al., "Colossal magnetoresistance of 1000000-fold magnitude achieved in the antiferromagnetic phase of $La_{1-x}Ca_xMnO_3$," Applied Physics Letters, Vol. 67, No. 12, 18 Sep. 1995, which is hereby incorporated by reference for all purposes.

Further, it has been found that some polycrystalline materials may have lower resistivities than their amorphous and single crystal counterparts. It has also been observed that magnitude of the resistance changes in single crystal CMO films exceeds that of the polycrystalline films. Large changes (i.e., greater than about 10x), are, however, not typically necessary for making a practical memory chip.

In light of the above, some specific CMO materials suitable for use with this invention will have the following properties: (1) the thickness of the deposited complex metal oxide film is between 1000 Å and 3000 Å; (2) the deposition and cool down and post deposition annealing (if any) is performed in an oxygen rich ambient; (3) the ratio of the rare earth and alkaline earth metals is adjusted for lowest resistivity, e.g., about 0.5; (4) the material is deposited or annealed to give a polycrystalline structure; (5) the material is deposited or annealed to increase the percentage of crystallites in a preferred orientation; and (6) the CMO material is doped with a material that has the effect of pinning the oxygen vacancies. Regarding the last property, it has been found that a small percentage of chrome doping also has a beneficial effect on reliability and endurance of some CMO films.

In addition to the above properties, certain process and design features are important. First, the seed layer or other "substrate" on which the CMO deposits impacts the resistivity of the CMO and other properties. Often the underlying crystallographic orientation of the substrate will epitaxially propagate to the upper levels the CMO element. So, for example, if the underlying substrate has a 100 orientation, then the CMO may preferentially deposit in a 100 orientation. Preferably, the underlying substrate is a conductive electrode such a noble metal (e.g., platinum) or relatively conductive CMO such as $LaNiO_3$. In polycrystalline structures, suitable crystallite sizes may range from about 100 Å to about 500 Å.

The general process operations for creating a complex metal oxide memory element include (1) providing a substrate on which to directly form the memory element, (2) depositing the memory element material on the substrate, and optionally (3) post-processing the deposited material to impart a desired property. As indicated above, the substrate material should be polycrystalline or single crystalline, be conductive, and serve as an electrode.

Various physical vapor deposition (PVD) and chemical vapor deposition (CVD) techniques may be employed. Many forms of PVD and CVD can be employed, assuming that they operate at temperatures compatible with the overall device fabrication technology. Post-processing operations must also meet the temperature strictures of the technology. Often, this means that the deposition process should operate at temperatures below 600° C.

Although thin-film processes such as facing target sputtering and laser annealing after deposition might allow for the formation of a crystalline memory element at temperatures low enough to use copper or aluminum conductive array lines, most thin-film processes would require temperatures of about 600° C. to form crystalline memory elements. Therefore, any layers of conductive array lines underneath the memory elements would need to withstand those temperatures.

Figure 9:
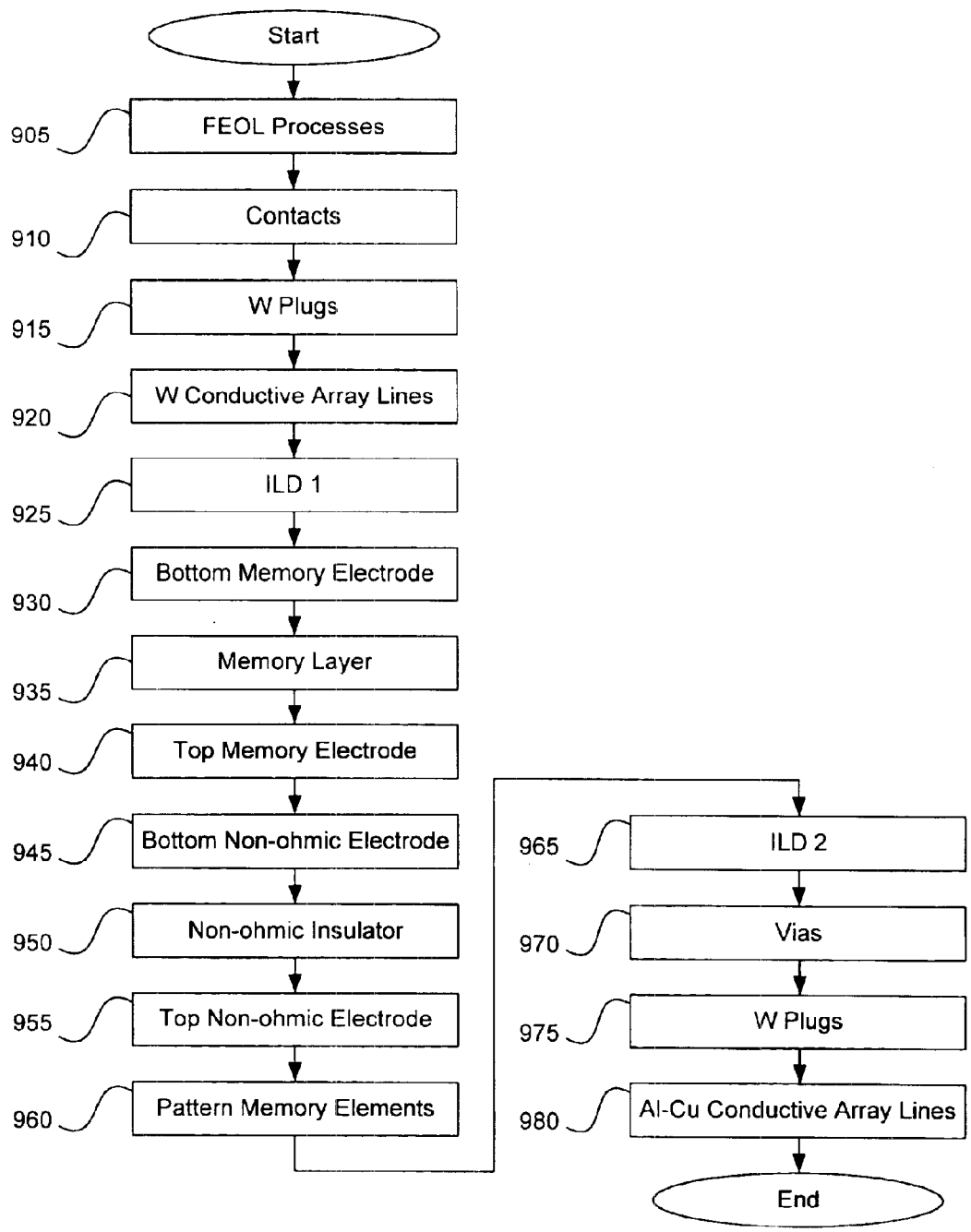
FIG. 9 is an exemplary flow chart of various processing steps that could be involved in a cross point array.
Figure 10:
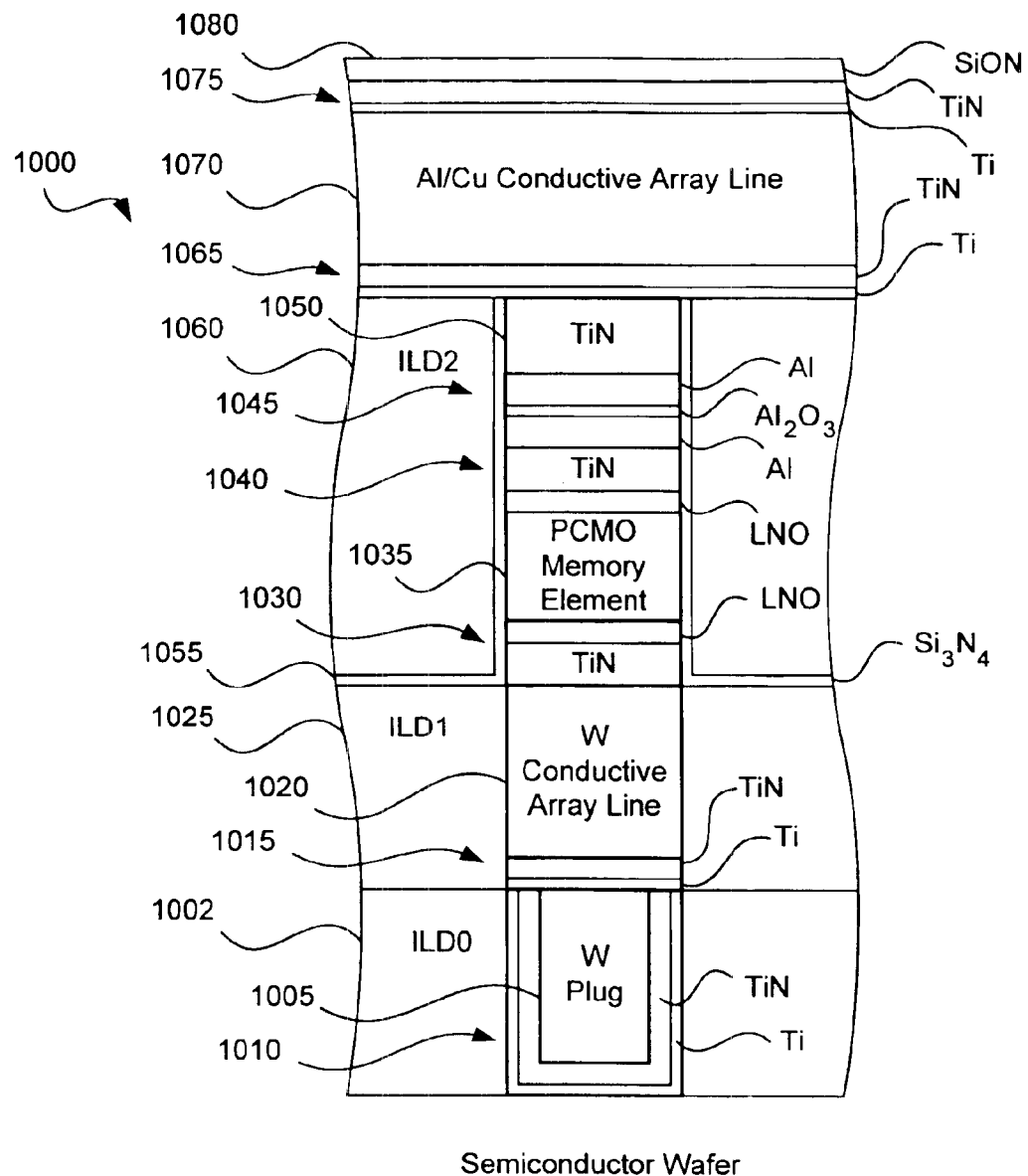
FIG. 10 is an exemplary memory cell that is formed using the processing steps in a side view.

As an example, conductive array lines of tungsten (W) will withstand high temperature processes. FIG. 9 is an exemplary flow chart of various processing steps that could be involved in a W cross point array. FIG. 10 is an elevation view of a cell 1000 formed with the processing steps. At 905, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD) 1002, such as $SiO_2$.

Regardless of the FEOL process, the next processing step at 910 is formation of contact holes through the ILD 1002 to appropriate positions in the circuitry followed by W plug 1005 formation at 915. A barrier/adhesion layer 1010 of 100 Å of Ti followed by 200 Å of TiN could be sputtered on the wafer, followed by 5000 Å of W deposited using CVD, followed by etchback or CMP to remove W on the ILD surface 1002, leaving W plugs 1005 in the contact holes.

Once the plugs are formed, the W conductive array lines 1020 are patterned on the wafer at 920. Since W has a relatively high resistivity, the maximum length and minimum cross-sectional area may be limited in comparison to aluminum or copper. Specifically, the maximum length and cross-sectional area of the conductive array lines 1020 can be determined using Error! Objects cannot be created from editing field codes, and setting a maximum resistance to about 10 kΩ in order to maintain fast access times. Assuming 5000 Å thick metallization layers and a feature size of 0.25 µm, the length of the conductive array lines 1020 would be a maximum of about 2000 µm long. The W conductive array lines 1020 can be achieved through a barrier/adhesion layer 1015 of 100 Å of Ti plus 200 Å of TiN, followed by 5000 Å of W deposition through CVD, followed by mask, etch, and resist strip steps.

Another ILD layer 1025 could be deposited over the first layer of conductive array lines at 925. The dielectric layer 1025 can be a thick layer of $SiO_2$, deposited over the W conductive array lines 1020 by plasma-enhanced chemical vapor deposition (PECVD) and then planarized by CMP to expose the top surfaces of the W lines 1020.

At step 930 the bottom electrodes 1030 are deposited. First, a 500 Å thick barrier layer of TiN is deposited to prevent metal inter-diffusion, followed by a 200 Å seed layer of $LaNiO_3$ (LNO) or $SrRuO_3$ (SRO). These layers can be deposited by sputtering.

At step 935 approximately 2000 Å of memory material 1035 having a stoichiometry of $Pr_{0.7}Ca_{0.3}MnO_3$ is deposited at about 600° C. by a physical vapor deposition technique such as sputtering. As previously explained, the memory element 1035 would have a low resistance of 100 k Ohm and a high resistance of 1M Ohm, and would change state with a less than 50 ns flat pulse at 2V. At 940 another electrode 1040 (200 Å of LNO or SRO and another 500 Å of TiN are deposited via sputtering) is deposited on top of the memory element 1035.

At 945 through 955 the non-ohmic device 1045 is formed. The device 1045 can be formed by first sputtering 250 Å of Al, followed by 50 Å of $Al_2O_3$, and another 250 Å of sputtered Al. The $Al_2O_3$ could be formed by atomic layer deposition (ALD) or oxidization of Al. The $Al_2O_3$ thickness would be chosen to achieve a $V_{NO+}$ of 4V. After the non-ohmic device 1045, another 500 Å barrier layer 1050 of sputtered TiN is optionally deposited in step 955 to prevent metal inter-diffusion.

At 960 standard photolithography and appropriate multi-step etch processes could be used to pattern the memory/non-ohmic film stack into memory cell plug. At 965 the spaces between the plugs could then be filled in by depositing a 250 Å etch stop/diffusion barrier 1055 of $Si_3N_4$, followed by a thick $SiO_2$ interlayer dielectric (ILD) 1060, which is planarized by CMP.

At 970 via holes are formed. Via holes with W plugs could be formed to provide connections between metal interconnect layers. Standard photolithography and via etch could be used to make via holes. These via holes could be filled by depositing 100 Å of Ti, followed by 200 Å of TiN, followed by a 5000 Å W layer. CMP could then be used to remove W on the ILD surface 1060, leaving the W plugs in the via holes.

If there are no more memory elements to form at high temperature, the final layer of conductive array lines may comprise aluminum, copper or other high conductivity metal. A top layer of conductive array lines could then be formed at 980 by depositing, in order, another barrier/adhesion layer 1065 of 100 Å of Ti and 200 Å of TiN, then the conductive array line 1070 comprising 5000 Å of an Al/Cu mixture, and then a final barrier/adhesion layer 1075 of 100 Å of Ti, 200 Å of TiN. An anti-reflective coating (ARC) 1080, such as SiON could also be deposited. A final mask, etch and resist strip would then be performed. The final cross-point memory array could then be 16384 W conductive array lines by 4096 Al/Cu conductive array lines to create a 64 Mbit array. 16 of these arrays could be laid side-by-side to create a 1 Gbit memory.

Note that the above example assumes that memory elements are formed by a high temperature process that could be incompatible with conventional aluminum and copper deposition processes. Other processes for forming memory elements at low temperatures exist. These include facing target sputtering and laser annealing.

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A method comprising:
   providing a first layer of conductive array lines, the conductive array lines being arranged so that they do not come into direct contact with each other;
   providing a second layer of conductive array lines, the conductive array lines being arranged so that they do not come into direct contact with either each other or any of the conductive array lines of the first layer;
   selecting at least one conductive array line pair, the conductive array line pair being one of the conductive array lines from the first layer and one of the conductive array lines of the second layer;
   applying a read voltage across the at least one conductive array line pair during a read mode, the read voltage producing a read current, wherein the read current is indicative of a first program state when the read current is at a first level and indicative of a second program state when the read current is at a second level, the read current being ineffective to produce a change in program state;
   applying a first voltage pulse across the least one conductive array line pair during a first write mode if in the second program state, wherein the first voltage pulse is effective to modify the programming state from the second program state to the first program state; and
   applying a second voltage pulse across the least one conductive array line pair during a second write mode if in the first program state, wherein the second voltage pulse is effective to modify the programming state from the first program state to the second program state.

2. The method of claim 1, wherein the conductive array line pair represents the exclusive electrical path to a memory plug defined by the conductive array line pair.

3. The method of claim 2, wherein the memory plug includes an oxide that is sensitive to the first voltage pulse and the second voltage pulse.

4. The method of claim 3, wherein the oxide is crystalline.

5. The method of claim 4, wherein the oxide is polycrystalline.

6. The method of claim 2, wherein the memory plug includes a non-ohmic device that exhibits a high resistance regime for a certain range of voltages and a low resistance regime for voltages above and below that range.

7. The method of claim 6, wherein the read voltage, first write voltage and second write voltage are all within the low resistance regime.

8. A cross point array comprising:
   a first layer of conductive array lines, the conductive array lines being arranged so that they do not come into direct contact with each other;
   a second layer of conductive array lines, the conductive array lines being arranged so that they do not come into direct contact with either each other or any of the conductive array lines of the first layer;
   wherein a first voltage pulse is applied across at least one conductive array line pair during a first read mode, the conductive array line pair being one of the conductive array lines from the first layer and one of the conductive array lines of the second layer;
   wherein a second voltage pulse is applied across at least one conductive array line pair during a second write mode;
   wherein a read voltage is applied across at least one conductive array line pair during a read mode, the read voltage producing a read current;
   wherein the read current from a conductive array line pair is at a first level subsequent to the conductive array line pair having the first voltage pulse applied during the first write mode and before the second voltage is applied during the second write mode;
   wherein the read current from a conductive array line pair is at a second level subsequent to the conductive array line pair having the second voltage pulse applied during the second write mode and before the first voltage is applied during the first write mode.

* * * * *

UNITED STATES PATENT AND TRADEMARK OFFICE
CERTIFICATE OF CORRECTION

PATENT NO. : 6,909,632 B2  Page 1 of 1
DATED : June 21, 2005
INVENTOR(S) : Darrell Rinerson et al.

It is certified that error appears in the above-identified patent and that said Letters Patent is hereby corrected as shown below:

Column 3,
Lines 30-34, delete "Additionally, a CMO memory plug would preferably include a non-ohmic device, as is described in co-pending application "High Density NVRAM," U.S. application Ser. No. 10/360,005, filed Feb. 7, 2003." and insert -- Additionally, a CMO memory plug would preferably include a non-ohmic device. --.

Signed and Sealed this

Eleventh Day of April, 2006

JON W. DUDAS
*Director of the United States Patent and Trademark Office*